United States Patent
Drewes

(10) Patent No.: US 7,034,374 B2
(45) Date of Patent: Apr. 25, 2006

(54) MRAM LAYER HAVING DOMAIN WALL TRAPS

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 10/645,981

(22) Filed: Aug. 22, 2003

(65) Prior Publication Data

US 2005/0041463 A1     Feb. 24, 2005

(51) Int. Cl.
    *H01L 29/82* (2006.01)
(52) U.S. Cl. ............... 257/421; 257/295; 257/E43.001; 257/E29.167; 257/E29.323; 257/E21.663; 257/E21.665
(58) Field of Classification Search ............... 438/3; 257/421
    See application file for complete search history.

(56) References Cited

U.S. PATENT DOCUMENTS

| | | | | |
|---|---|---|---|---|
| 5,476,680 A | * | 12/1995 | Coffey et al. | 427/130 |
| 5,748,524 A | * | 5/1998 | Chen et al. | 365/173 |
| 5,898,612 A | * | 4/1999 | Chen et al. | 365/158 |
| 5,917,749 A | * | 6/1999 | Chen et al. | 365/173 |
| 5,956,267 A | | 9/1999 | Hurst et al. | |
| 5,978,257 A | * | 11/1999 | Zhu et al. | 365/173 |
| 6,048,739 A | | 4/2000 | Hurst et al. | |
| 6,205,053 B1 | * | 3/2001 | Anthony | 365/173 |
| 6,392,922 B1 | | 5/2002 | Liu et al. | |
| 6,445,554 B1 | * | 9/2002 | Dong et al. | 360/324.2 |
| 6,577,529 B1 | | 6/2003 | Sharma et al. | |
| 6,781,871 B1 | * | 8/2004 | Park et al. | 365/158 |
| 6,888,743 B1 | * | 5/2005 | Durlam et al. | 365/158 |
| 2001/0030886 A1 | | 10/2001 | Thewes et al. | |
| 2001/0050859 A1 | | 12/2001 | Schwarzl | |

\* cited by examiner

*Primary Examiner*—Andy Huynh
(74) *Attorney, Agent, or Firm*—Knobbe, Martens, Olson & Bear, LLP

(57) ABSTRACT

A common pinned layer is shared by multiple memory cells in an MRAM device. The common pinned layer includes a plurality of domain wall traps that prevent the formation of domain walls within a region of the common pinned layer corresponding to a given memory cell. Therefore, the memory cells can advantageously be formed such that the domain walls, to the extent they exist, fall between (rather than within) the memory cells, thereby improving the performance of the MRAM device.

18 Claims, 3 Drawing Sheets

MRAM LAYER HAVING DOMAIN WALL TRAPS

BACKGROUND OF THE INVENTION

1. Field of the Invention

The present invention relates to magnetic random access memory (MRAM) devices. More specifically, the present invention relates to MRAM devices in which a plurality of cells share a common magnetic layer.

2. Description of the Related Art

Magnetic random access memory (MRAM) is a well-known form of memory. In an MRAM device, digital bits of information can be stored as alternative directions of magnetization in a magnetic storage element or cell. The storage elements may be simple structures, such as thin ferromagnetic films, or more complex layered magnetic thin-film structures, such as tunneling magnetoresistance (TMR) or giant magnetoresistance (GMR) elements.

An exemplary TMR memory cell comprises two magnetic layers separated by a barrier layer. One magnetic layer, referred to as the "pinned" layer, has a fixed magnetization direction, whereas the magnetization direction of the other magnetic layer, referred to as the "sense" layer, can be reversed by applying a magnetic field that is not strong enough to affect the magnetization direction of the pinned layer.

A TMR memory cell can operate by allowing a quantum mechanical tunneling of electrons from one magnetic layer to the other through the barrier layer of the cell. The passage of electrons through the barrier layer depends upon the magnetization direction of the sense layer relative to that of the pinned layer. Electrons pass more freely when the magnetic directions of the layers are aligned and less freely when the magnetic directions of the layers are not aligned. Therefore, the state of a TMR memory cell can be determined by observing the degree of electron tunneling through the barrier layer. GMR memory cells operate similarly by sensing current flow or resistance through aligned or anti-aligned magnetic layers, rather than by employing a tunneling dielectric.

A plurality of magnetic memory cells can be organized into an array having any of a wide variety of configurations. One exemplary configuration is a "cross-point" memory array, which comprises a first set of parallel conductive lines covered by an insulating layer, over which lies a second set of parallel conductive lines, perpendicular to the first lines. One set of conductive lines is referred to as the "bit" lines, and the other set of conductive lines is referred to as the "word" lines. The magnetic memory cells can be sandwiched between the bit lines and the word lines at their intersections.

SUMMARY OF THE INVENTION

In some MRAM devices, each memory cell has a unique set of layers. That is, each individual memory cell may have a pinned layer, a barrier layer, and a sense layer, but none of these layers is shared by more than one cell. In other MRAM devices, multiple memory cells share a common pinned layer. For example, a pinned layer may be shared by a plurality of cells within a given row or column of a memory array. In these devices, the pinned layer can be formed as a continuous line of magnetic material. Individual memory cells can be formed by depositing additional layers of material on the continuous pinned layer and patterning the additional layers to form the cells.

In one embodiment, a plurality of magnetic memory cells comprise a first magnetic layer shared by the plurality of magnetic memory cells and a plurality of second magnetic layers, each of which corresponds to a separate one of the plurality of magnetic memory cells. The first magnetic layer comprises a plurality of domain wall traps formed at predetermined intervals between the magnetic memory cells.

In another embodiment, an MRAM device comprises a magnetic layer common to a plurality of magnetic memory cells, wherein the magnetic layer is configured to prevent the formation of a magnetic domain wall within a region of the magnetic layer corresponding to a given memory cell.

In another embodiment, a method of forming an MRAM device, comprises forming a first magnetic layer on a substrate, the first magnetic layer having a plurality of magnetic domains separated by a plurality of magnetic domain walls, wherein a plurality of domain wall traps are formed at predetermined intervals within the first magnetic layer. The method further comprises exposing the first magnetic layer to a magnetic field, thereby rearranging the magnetic domains within the first magnetic layer such that each magnetic domain wall is located within a domain wall trap.

BRIEF DESCRIPTION OF THE DRAWINGS

These and other features and advantages of the invention will now be described with reference to the drawings of certain preferred embodiments, which are intended to illustrate, and not to limit, the invention.

DETAILED DESCRIPTION OF THE PREFERRED EMBODIMENT

For purposes of illustration, various embodiments of the invention will be described in the context of a particular memory device. The details associated with this specific implementation of the memory device are set forth to illustrate, and not to limit, the invention. The scope of the invention is defined only by the appended claims.

Figure 1A:
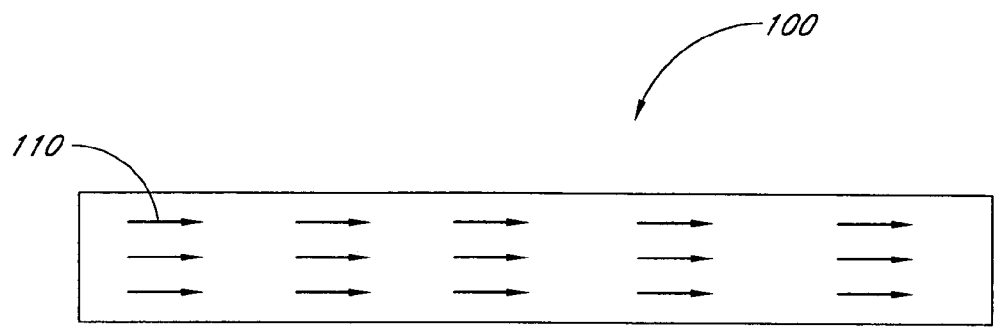
FIGS. 1A–C illustrate a top-down view of a surface of a continuous pinned layer shared by multiple cells of an MRAM device.

FIG. 1A illustrates a top-down view of a surface of a continuous pinned layer 100 to be shared by multiple cells of an MRAM device. The continuous pinned layer 100 may comprise several layers and may be formed using a wide variety of well-known materials and methods. For example, the continuous pinned layer 100 may comprise a vertically stacked set of sublayers including a tantalum seed sublayer, a nickel-iron seed sublayer, a magnesium oxide, iridium-manganese, platinum-manganese or nickel-manganese pinning sublayer, and a nickel-iron, nickel-iron-cobalt, cobalt-iron or nickel-iron-chromium sublayer.

Individual memory cells can be formed over the continuous pinned layer 100 using techniques and materials that are well-known to those of skill in the art. For example, in some embodiments, the continuous pinned layer 100 can be patterned, followed by the deposition and patterning of additional layers of material over the continuous pinned layer 100 to form individual memory cells. In other exemplary embodiments, the additional layers comprising the individual memory cells can be deposited over the continuous pinned layer 100 before it is patterned, and a first set of masking and etching steps can be performed to pattern the continuous pinned layer 100, followed by a second set of masking and etching steps to pattern the individual memory cells.

In some embodiments, each individual memory cell comprises a barrier layer and a sense layer deposited on top of the continuous pinned layer 100. The barrier layer of the memory cells may comprise, for example, aluminum oxide. The sense layer of the memory cells may comprise a stack of sublayers, such as, for example, a tantalum sublayer, a tungsten nitride sublayer, and a nickel-iron, nickel-iron-cobalt, cobalt-iron, cobalt or copper sublayer. Those of ordinary skill in the art will understand that the continuous pinned layer 100, the barrier layer, and the sense layer may comprise various combinations or subcombinations of the exemplary materials listed above and/or a wide variety of other suitable materials.

The continuous pinned layer 100 has numerous magnetic moments 110 that define the magnetization direction of the continuous pinned layer 100. In the example illustrated in FIG. 1A, the magnetic moments 110 are aligned such that the continuous pinned layer 100 has only a single magnetization direction. Because the operation of a magnetic memory cell depends upon the magnetization direction of the sense layer of the cell relative to that of the pinned layer 100, it is desirable to configure the continuous pinned layer 100 such that its magnetization direction is predictable and stable. Accordingly, the alignment of the magnetic moments 110 to create a single magnetization direction within the continuous pinned layer 100, as illustrated in FIG. 1A, advantageously enhances the performance of the MRAM device.

Figure 1B:
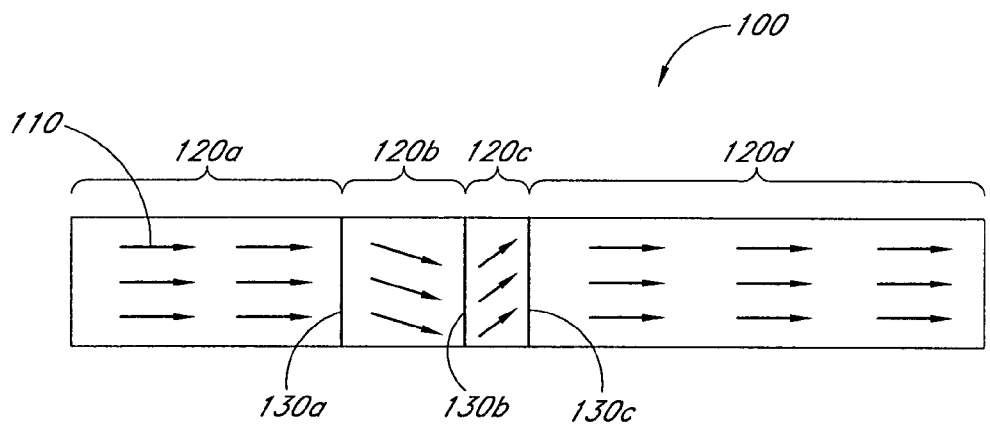

As illustrated in FIG. 1B, however, the continuous pinned layer 100 often has a number of regions, referred to as domains 120a–d, with differing magnetization directions. The existence of domains 120a–d within the continuous pinned layer 100 can be caused by a number of factors, such as, for example, imperfections in the continuous pinned layer 100 and variations in the fabrication process. The boundaries of the domains 120a–d are defined by a plurality of domain walls 130a–c. The domain walls 130a–c can be subject to shifting within the continuous pinned layer 100 in response to magnetic fields applied to the continuous pinned layer 100 during programming or writing. Therefore, the domains 120a–d reduce the predictability and stability of the magnetization direction of the continuous pinned layer 100, and thus interfere with the performance of the MRAM device.

Figure 1C:
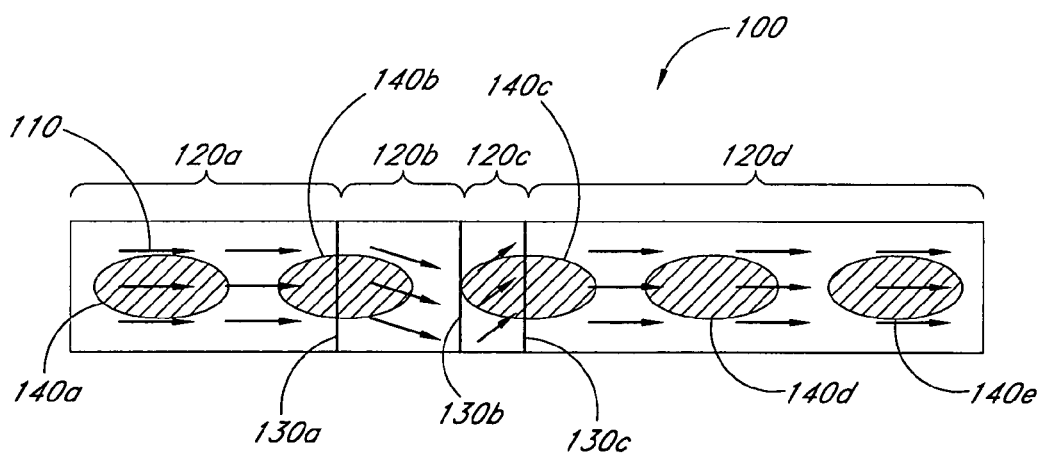

FIG. 1C illustrates the continuous pinned layer 100 of FIG. 1B following the fabrication of a plurality of memory cells 140a–e thereover through additional process steps. Those of skill in the art will understand that the memory cells 140a–e can be formed using a variety of well-known materials and methods. The pinned layer 100 of a given memory cell 140a–e preferably has only a single magnetization direction. If the magnetization direction varies within the pinned layer 100 of a memory cell 140a–e, then the performance of the memory cell 140a–e is negatively impacted. Therefore, the existence of domains 120a–d within the continuous pinned layer 100 is particularly undesirable when a domain wall 130a–c falls within a given memory cell 140a–e (i.e., under the remaining layers that define the memory cell 140a–e).

While one domain wall 130b illustrated in FIG. 1C falls between two memory cells 140b, 140c, the remaining two domain walls 130a, 130c fall within memory cells 140b, 140c. Accordingly, the presence of the domains 120a–d within the continuous pinned layer 100 illustrated in FIG. 1C will have a particularly negative effect on the performance of the corresponding MRAM device. Because domains 120a–d can be caused by such a wide variety of factors during the fabrication of the continuous pinned layer 100, it may not be practical to fabricate such a layer without creating at least some domains. Nevertheless, if the domain walls 130a–c are located between (rather than within) the memory cells 140a–e, then the negative impact of the domains 120a–d on the performance of the MRAM device is advantageously reduced.

Figure 2A:
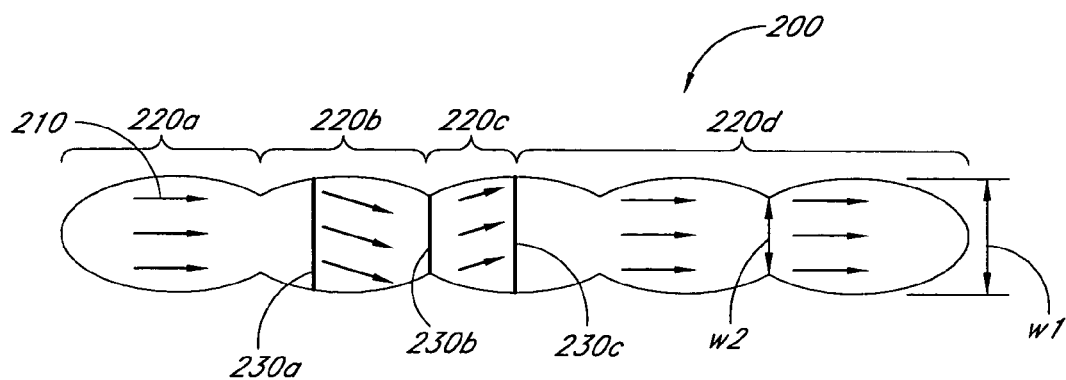
FIGS. 2A–C illustrate a top-down view of a surface of a pinned layer having a plurality of domain wall traps.
Figure 2B:
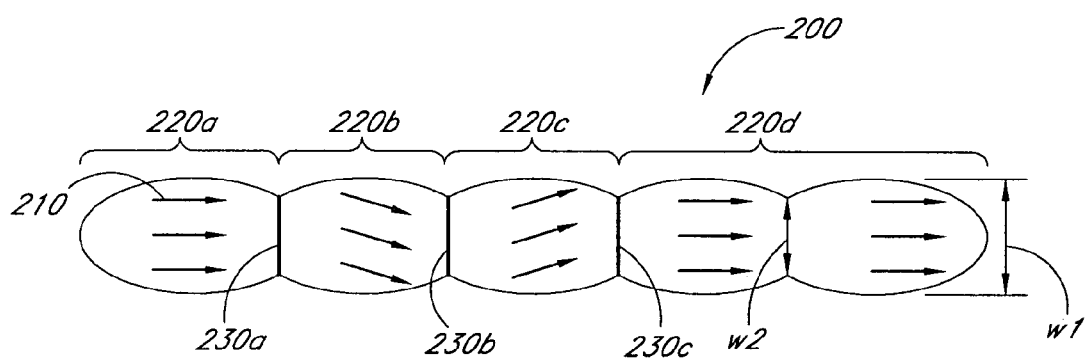
Figure 2C:
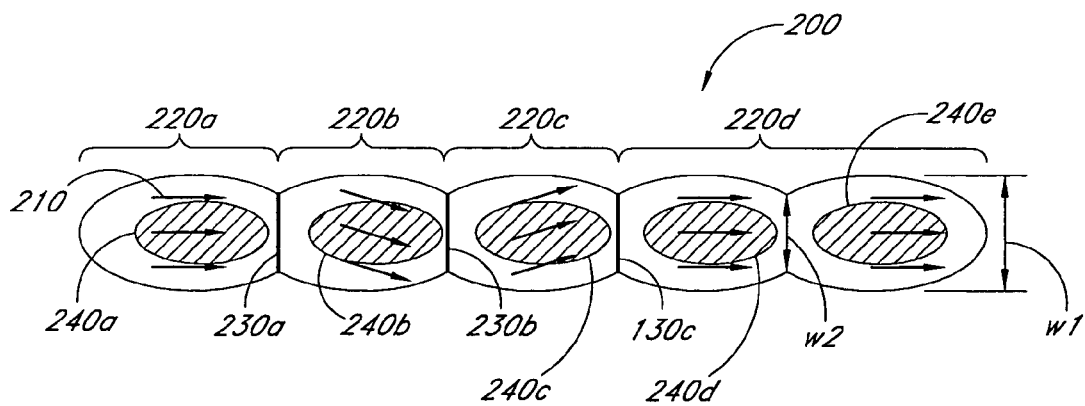

FIGS. 2A–C illustrate a top-down view of a surface of a pinned layer 200 of an MRAM device. Like the continuous pinned layer 100 discussed above, the pinned layer 200 illustrated in FIGS. 2A–C can be formed using a wide variety of well-known materials and methods. Although the pinned layer 200 has a plurality of domains 220a–d separated by domain walls 230a–c, the pinned layer 200 has a series of domain wall traps, which advantageously allow the location of domain walls 230a–c within the pinned layer 200 to be controlled and predicted.

Figure 3:
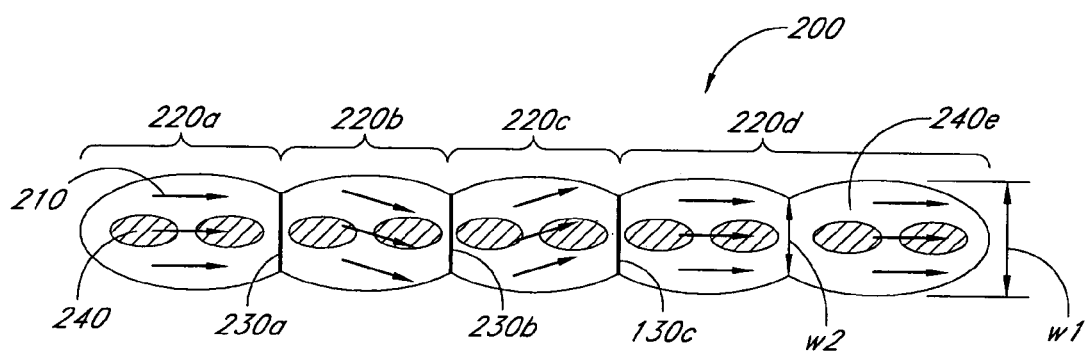
FIG. 3 illustrates a top-down view of a surface of a notched pinned layer having a multiple memory cells formed between each pair of consecutive notches.
Figure 4:
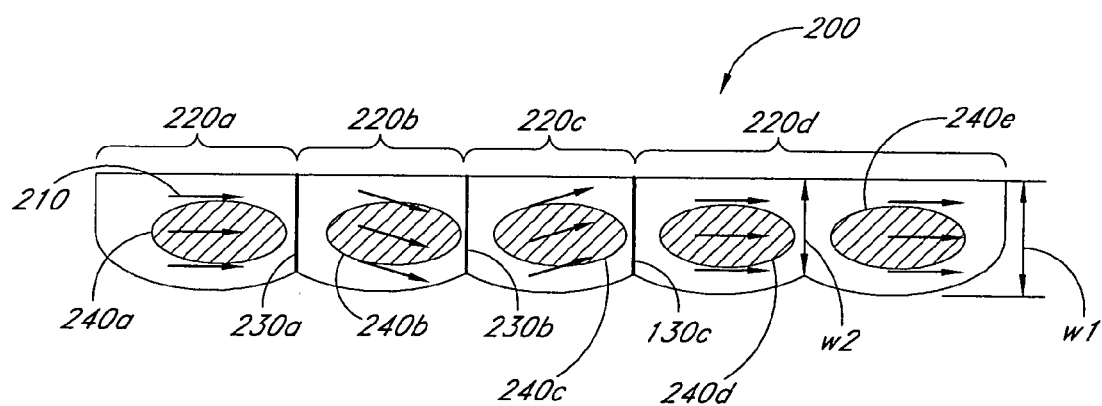
FIG. 4 illustrates a top-down view of a surface of a notched pinned layer in which the notches are formed along only a single side of the pinned layer.

Generally speaking, a domain wall trap may comprise any feature of the pinned layer 200 that tends to hold a domain wall in place. For example, in the embodiment illustrated in FIGS. 2A–C, the domain wall traps comprise notches, or regions in which the width of the pinned layer 200 is narrowed, along the length of the pinned layer 200. Although the notches are formed between each pair of consecutive memory cells in the example illustrated in FIGS. 2A–C, the notches could be formed at different intervals along the length of the pinned layer 200 such that, for example, multiple memory cells are formed between each pair of consecutive notches, as illustrated in FIG. 3. In addition, the notches could be formed along only a single side of the pinned layer 200, as illustrated in FIG. 4, or could have a different shape than that illustrated in FIGS. 2A–C. Moreover, in other embodiments, the domain wall traps may comprise features other than notches, such as, for example, other variations in the shape of the pinned layer 200, or intentionally formed (and therefore controlled) variations in the materials forming the pinned layer 200. For example, implants could be used to vary the material of the pinned layer 200 at predetermined intervals along its length.

FIG. 2A illustrates the pinned layer 200 immediately after it has been formed. At this stage in the fabrication process, the domain walls 230a–c can be randomly distributed throughout the pinned layer 200, as illustrated in FIG. 2A. However, the notches within the pinned layer 200 tend to act as traps for domain walls. This trapping effect is caused by the fact that once a domain wall 230a–c falls within a notch of the pinned layer 200, a relatively high amount of energy is required to move the domain wall 230a–c out of the notch. Thus, when a domain wall 230a–c falls within a notch, it tends to remain in place.

The relative dimensions of the pinned layer 200 can vary widely based on a number of factors. For example, as the width w2 of the notches is reduced relative to the width w1 of the pinned layer 200, the notches become more effective domain wall traps. Therefore, this factor suggests that the notches should be as narrow as possible. On the other hand, reducing the width w2 of the notches increases the overall line resistance of the pinned layer 200. Therefore, this factor suggests that the notches should be as wide as possible. These and other factors can be considered when the relative dimensions of the pinned layer 200 are determined. Based on the relative importance of these factors in the context of a particular implementation, those of ordinary skill in the art can determine appropriate dimensions for the pinned layer 200.

For example, in some embodiments, the width w2 of the notches can range from about 25% to about 85% of the width w1 of the pinned layer 200. In some embodiments, the width w1 of the pinned layer 200 can range from about 0.2 µm to about 1 µm. Therefore, if the width w1 of the pinned layer 200 is about 0.2 µm, then the width w2 of the notches may range from about 0.05 µm to about 0.17 µm, and if the width w1 of the pinned layer 200 is about 1 µm, then the width w2 of the notches may range from about 0.25 µm to about 0.85 µm.

The domain walls 230a–c can be shifted within the pinned layer 200 by applying a magnetic field to the pinned layer 200 during an anneal. Therefore, after the pinned layer 200 is formed, it can be subjected to a magnetic field to shift the domain walls 230a–c into the trap regions of the pinned layer 200, as illustrated in FIG. 2B. The magnetic field used to shift the domain walls 230a–c into the trap regions can be the same magnetic field used to set the magnetization direction of the pinned layer 200. By subjecting the pinned layer 200 to such a magnetic field, the location of domain walls 230a–c within the pinned layer 200, to the extent they exist, can advantageously be predicted by placing domain wall traps at predetermined locations within the pinned layer 200. In some embodiments, the strength of the magnetic field applied to the pinned layer 200 preferably falls within the range of about $10^{-4}$ Tesla (T) to about 2 T, more preferably within the range of about 0.1 T to about 2 T, and more preferably within the range of about 1 T to about 2 T.

FIG. 2C illustrates the pinned layer 200 of FIG. 2B after the memory cells 240a–e have been formed on the pinned layer 200. The memory cells 240a–e can be formed using a variety of techniques and materials that are well-known to those of skill in the art. Because the domain wall traps within the pinned layer 200 allow the location of the domain walls 230a–c to be predicted, the memory cells 240a–e can advantageously be formed such that the domain walls 230a–c, to the extent they exist, fall between (rather than within) the memory cells 240a–e, as illustrated in FIG. 2C.

One advantage of ensuring that the domain walls 230a–c fall between the memory cells 240a–e is that magnetic moments 210 within the pinned layer 200 of a given memory cell 240a–e are aligned such that it has only a single magnetization direction. Thus, because the magnetization direction does not vary within the pinned layer 200 of a given memory cell 240a–e, the negative effect of the domains 220a–d on the performance of the memory device is advantageously reduced.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

What is claimed is:

1. A plurality of magnetic memory cells, comprising:
   a pinned magnetic layer shared by the plurality of magnetic memory cells, wherein the pinned magnetic layer comprises a plurality of domain wall traps formed at predetermined intervals between the magnetic memory cells; and
   a plurality of second magnetic layers, each of which corresponds to a separate one of the plurality of magnetic memory cells.

2. The plurality of magnetic memory cells of claim 1, wherein a domain wall trap is formed between each pair of consecutive magnetic memory cells.

3. The plurality of magnetic memory cells of claim 1, wherein multiple magnetic memory cells are formed between each pair of consecutive domain wall traps.

4. The plurality of magnetic memory cells of claim 1, wherein the pinned magnetic layer comprises a plurality of sublayers comprising tantalum, nickel-iron, magnesium oxide, iridium-manganese, platinum-manganese, nickel-manganese, and/or cobalt-iron.

5. The plurality of magnetic memory cells of claim 1, wherein the second magnetic layers comprise a plurality of sublayers comprising tantalum, tungsten nitride, nickel-iron, cobalt, and/or copper.

6. The plurality of magnetic memory cells of claim 1, wherein the magnetic memory cells comprise tunneling magnetoresistance (TMR) memory cells.

7. The plurality of magnetic memory cells of claim 6, further comprising one or more barrier layers located between the pinned magnetic layer and the plurality of second magnetic layers within the plurality of magnetic memory cells.

8. The plurality of magnetic memory cells of claim 7, wherein the one or more barrier layers comprise aluminum oxide.

9. The plurality of magnetic memory cells of claim 1, wherein the magnetic memory cells comprise giant magnetoresistance (GMR) memory cells.

10. A plurality of magnetic memory cells, comprising:
    a first magnetic layer shared by the plurality of magnetic memory cells; and
    a plurality of second magnetic layers, each of which corresponds to a separate one of the plurality of magnetic memory cells;
    wherein the first magnetic layer comprises a plurality of domain wall traps formed at predetermined intervals between the magnetic memory cells, wherein the domain wall traps comprise regions of the first magnetic layer having a narrower width than the remainder of the first magnetic layer.

11. The plurality of magnetic memory cells of claim 10, wherein the width of the narrow regions of the first magnetic layer falls within the range of about 25% to about 85% of the width of the remainder of the first magnetic layer.

12. The plurality of magnetic memory cells of claim 10, wherein the narrow regions of the first magnetic layer are created by forming notches along only a single side of the first magnetic layer.

13. An MRAM device comprising:
    a plurality of magnetic memory cells; and
    a pinned magnetic layer common to the plurality of magnetic memory cells, wherein the pinned magnetic layer is configured to locate a magnetic domain wall between memory cells, rather than within a region of the pinned magnetic layer corresponding to a given memory cell.

14. The MRAM device of claim 13, wherein the magnetic layer comprises a plurality of sublayers comprising tantalum, nickel-iron, magnesium oxide, iridium-manganese, platinum-manganese, nickel-manganese and/or cobalt-iron.

15. An MRAM device comprising:
    a magnetic layer common to a plurality of magnetic memory cells; and wherein the magnetic layer is configured to prevent the formation of a magnetic domain wall within a region of the magnetic layer corresponding to a given memory cell, wherein the width of the magnetic layer narrows at predetermined intervals along the length of the magnetic layer.

16. The MRAM device of claim 15, wherein the width of the narrow portions of the magnetic layer falls within the range of about 25% to about 85% of the width of the remainder of the magnetic layer.

17. An apparatus comprising:
a plurality of magnetic memory cells having a shared pinned layer; and
means for holding in place domain walls of the shared pinned layer.

18. The apparatus as defined in claim 17, wherein the holding means comprises one or more notches defined in the shared pinned layer between at least a first memory cell and a second memory cell.

* * * * *